US005945772A

United States Patent [19]

Macnak et al.

[11] Patent Number: 5,945,772

[45] Date of Patent: Aug. 31, 1999

[54] DAMPED RESONANT PIEZOELECTRIC ALERTING DEVICE

[75] Inventors: Philip P. Macnak, West Palm Beach; Thomas James Rollins, Boynton Beach, both of Fla.

[73] Assignee: Motorla, Inc., Schaumburg, Ill.

[21] Appl. No.: 09/087,309

[22] Filed: May 29, 1998

[51] Int. Cl.[6] ........ H01L 41/08

[52] U.S. Cl. ........ 310/326; 310/328

[58] Field of Search ........ 310/326, 328

[56] References Cited

U.S. PATENT DOCUMENTS

| | | | |
|---|---|---|---|
| 4,333,342 | 6/1982 | Gilden et al. | 310/329 |
| 4,600,854 | 7/1986 | Bednorz et al. | 310/331 |
| 4,950,931 | 8/1990 | Goldenberg et al. | 310/36 |
| 5,036,419 | 7/1991 | Okauchi et al. | 360/109 |
| 5,687,462 | 11/1997 | Lazarus et al. | 29/25.35 |

FOREIGN PATENT DOCUMENTS

| | | | |
|---|---|---|---|
| 61-32487 | 2/1986 | Japan | 310/332 |

*Primary Examiner*—Thomas M. Dougherty
*Attorney, Agent, or Firm*—Philip P. Macnak

[57] ABSTRACT

A damped resonant piezoelectric alerting device (600) includes a motional mass (130), a damping element (136, 156) magnetically coupled to the motional mass (130) and a piezoelectric actuator (100) which is constrained to an actuator mount (132) at a first end and coupled to the motional mass (130) at a second end. The piezoelectric actuator (100) responds to a control signal (108, 110) to generate an alternating out-of-plane movement (812, 814) of the motional mass (130) at an amplitude (412, 414). The alternating out-of-plane movement (812, 814) of the motional mass (130) is transformed into tactile energy to provide a tactile alert about a resonant frequency (608). The amplitude (412, 414) of the out-of-plane movement (812, 814) of the motional mass (130) is controlled by the damping element (136, 156). The alternating out-of-plane movement (812, 814) of the motional mass (130) is also transformed into acoustic energy to provide an audible alert above the resonant frequency (608).

15 Claims, 4 Drawing Sheets

1100

DAMPED RESONANT PIEZOELECTRIC ALERTING DEVICE

CROSS REFERENCE TO RELATED CO-PENDING APPLICATIONS

Related, co-pending applications include Patent Application, Attorney's Docket No. PT02959U, filed concurrently herewith, by Rollins, et al., entitled "Resonant Piezoelectric Alerting Device" which is assigned to the Assignee hereof.

FIELD OF THE INVENTION

This invention relates in general to alerting devices, and more specifically to a resonant piezoelectric alerting device.

BACKGROUND OF THE INVENTION

Tactile alerting devices have been widely used in electronic device to provide a tactile alert, sensibly alerting the user of the electronic device that an event has occurred, such as in alarm clock, of that information has been received, such as in a selective call receiver. Prior art tactile alerting devices have taken several forms, most notably a motor with an offset counterweight. Motors while they have been successfully used, generally draw a substantial amount of power, thereby limiting the operational life of such devices when a battery is used. Motors also occupy a significant volume of space, and while the size of the motor can be reduced, such size reductions are often at the expense of the level of tactile energy output that can be generated.

Non-linear tactile alerting devices have been utilized to replace motors as tactile alerting devices. The non-linear tactile alerting devices have significantly reduced the energy required to produce a given level of tactile energy produced, resulting in an increase in the life of a battery. While non-linear tactile alerting devices are a significant improvement over motors, the non-linear tactile alerting devices still require much the same space as that required by a motor.

What is needed is a tactile alerting device which required significantly less space then the prior art tactile alerting devices.

What is also required is a tactile alerting device which operates at a significantly reduced power consumption.

What is also needed is a method for controlling the tactile energy output delivered by the tactile alerting device.

What is needed is a tactile alerting device that can generate an audible alert.

DESCRIPTION OF THE PREFERRED EMBODIMENTS

Figure 1:
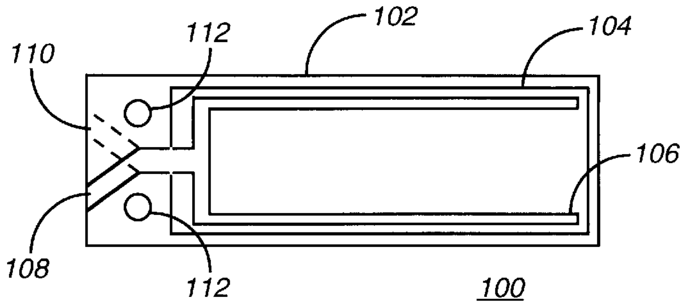
PRIOR ART FIG. 1
FIG. 1 is a top plan view of a prior art piezoelectric actuator utilized to produce electrically actuated valves, switches, relays, and pumps.
Figure 2:
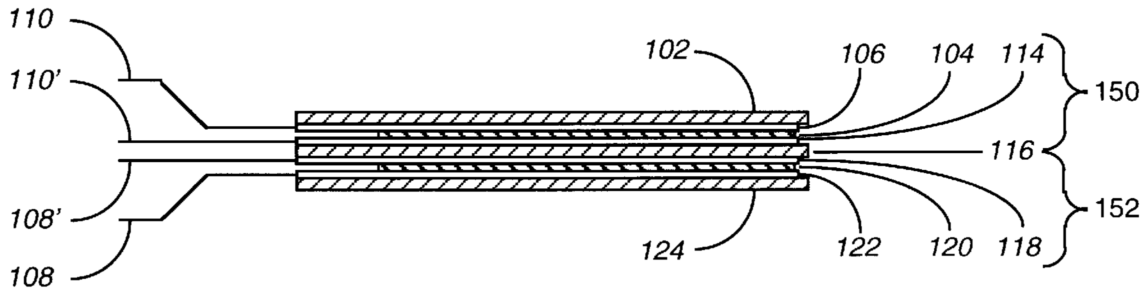
PRIOR ART FIG. 2
FIG. 2 is a cross-sectional view of the prior art piezoelectric actuator of claim 1.

FIG. 1 is a top plan view of a prior art piezoelectric actuator 100 utilized to produce such devices as electrically actuated valves, switches, relays, and pumps. The piezoelectric actuator is described in detail in U.S. Pat. No. 5,687,462 issued Nov. 18, 1997 to Lazarus et al. which is incorporated by reference herein. The piezoelectric actuator 100 comprises a flexible substrate 116, shown in the cross-sectional view of FIG. 2. A first electrode pattern 114 having an electrical input 110' is formed upon the flexible substrate 116. A first piezoelectric element 104 is bonded to the first electrode pattern 114 and the flexible substrate 116. The manner of bonding provides electrical connection between the first electrode pattern 114 and the first piezoelectric element 104. A second electrode pattern 106 having an electrical input 110 is formed on a first flexible protective layer 102 which is also bonded to the first piezoelectric element 104 in a manner to provide electrical connection between the second electrode pattern 106 and the first piezoelectric element 104. The flexible substrate 116, the first electrode pattern 114, the second electrode pattern 106, the first piezoelectric element 104, and the first flexible protective layer 102 form a first piezoelectric actuator element 150 of the prior art piezoelectric actuator 100.

A third electrode pattern 118 having an electrical input 108' is also formed upon the flexible substrate 116. A second piezoelectric element 120 is bonded to the third electrode pattern 118 and the flexible substrate 116. The manner of bonding provides electrical connection between the third electrode pattern 118 and the second piezoelectric element 120. A fourth electrode pattern 122 having an electrical input 108 is formed on a second flexible protective layer 124 which is also bonded to the second piezoelectric element 120 in a manner to provide electrical connection between the fourth electrode pattern 122 and the second piezoelectric element 120. The flexible substrate 116, the third electrode pattern 1118, the fourth electrode pattern 122, the second piezoelectric element 120, and the second flexible protective layer form a second piezoelectric actuator element 152 of the prior art piezoelectric actuator 100.

Figure 3:
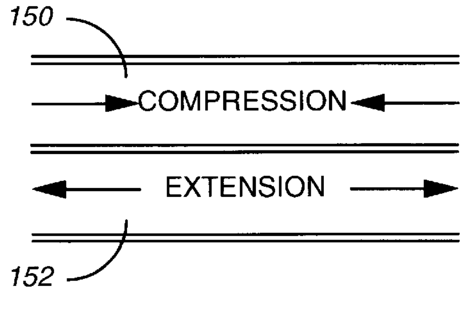
PRIOR ART FIG. 3
FIG. 3 is an illustration illustrating the prior art electromechanical operation of the piezoelectric actuator of claim 1.

Returning to FIG. 1, several mounting holes 112 (two of which are shown) enable the piezoelectric actuator 100 to be rigidly constrained to an actuator mount 132 to be described below. By way of example, application of a control signal causes the first piezoelectric actuator element 150 to bend through compression, and the second piezoelectric actuator element 152 to bend through extension, as shown in FIG. 3. The polarity of the control signal can be changed such as to cause the first piezoelectric actuator element to bend through extension and the second piezoelectric actuator element to bend through compression as will be described in further detail below.

Figure 4:
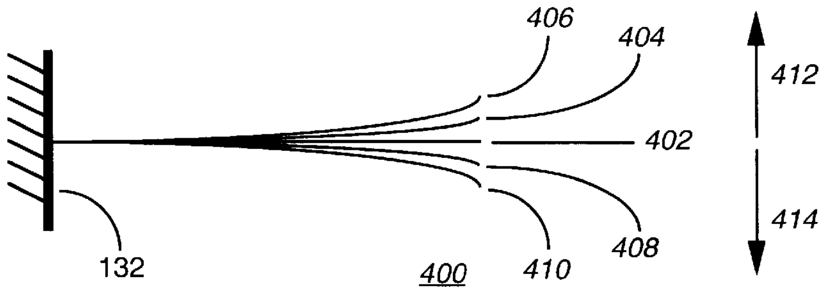
FIG. 4 is a mechanical diagram illustrating the operation of the prior art electromechanical operation of the piezoelectric actuator of claim 1.
Figure 5:
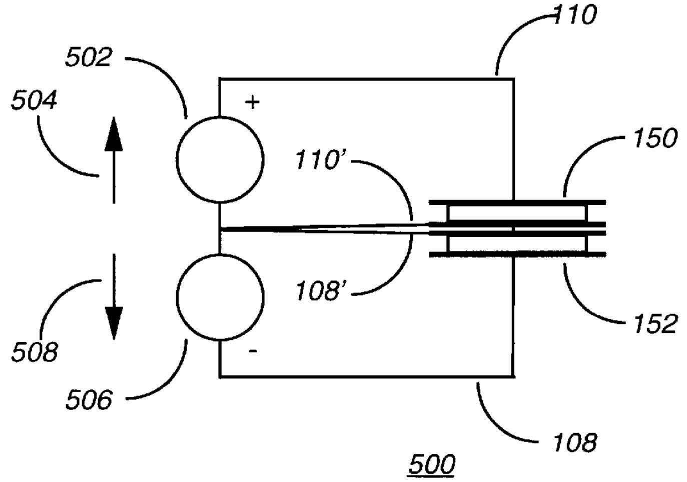
FIG. 5 is an electrical block diagram illustrating the driver circuit utilized to drive the prior art electro-mechanical operation of the piezoelectric actuator of claim 1.

The first piezoelectric actuator element 150 which comprises the flexible substrate 116, the first electrode pattern 114, the first piezoelectric element 104, the second electrode pattern 106, and the first flexible protective layer can be individually excited by a control signal 110, shown in FIG. 5, having a first polarity to provide a first out-of-plane movement 404 in a first direction 412 relative to the at rest, or unexcited position 402, as shown in FIG. 4. The first piezoelectric actuator element 150 can also be individually excited by a control signal 110 having a second opposite polarity to provide a second out-of-plane movement 408 in a second direction 414 relative to the at rest, or unexcited position 402, as shown in FIG. 4. The first out-of-plane movement 404 and the second out-of-plane movement 408 are linear movements of the first piezoelectric actuator element.

Likewise, the second piezoelectric actuator element 152 which comprises the flexible substrate 116, the third electrode pattern 118, the second piezoelectric element 120, the fourth electrode pattern 122, and the second flexible protective layer 124, can be individually excited by a control signal 108, shown n FIG. 5, having a first polarity to provide a first out-of-plane movement 404 in a first direction 412 relative to the at rest, or unexcited position 402, as shown in FIG. 4. The second piezoelectric actuator element 152 can also be individually excited by a control signal 108 having a second opposite polarity to provide a second out-of-plane movement 408 in a second direction 414 relative to the at rest, or unexcited position 402, as shown in FIG. 4. The first out-of-plane movement 404 and the second out-of-plane movement 408 are also linear movements of the second piezoelectric actuator element.

When the first piezoelectric actuator element 150 is excited by a control signal 110 having a first polarity, and the second piezoelectric actuator element 152 is concurrently excited by a control signal 108 having a second opposite polarity, a third out-of-plane movement 406 in the first direction 412 relative to the at rest, or unexcited position 402, is produced as shown in FIG. 4.

When the first piezoelectric actuator element 150 is excited by a control signal 110 having the second opposite polarity, and the second piezoelectric actuator element 152 is concurrently excited by a control signal 108 having the first polarity, a fourth out-of-plane movement 410 in the second direction 414 relative to the at rest, or unexcited position 402, is produced as shown in FIG. 4. It should be noted that when the first piezoelectric actuator element 150 and the second piezoelectric actuator element 152 are concurrently excited as described above, the amplitude of the linear movement of the piezoelectric actuator 100 is increased as compared to individually exciting either the first piezoelectric actuator element 150 or the second piezoelectric actuator element 152

FIG. 5 is an electrical block diagram illustrating the driver circuit 500 utilized to drive the prior art electromechanical operation of the piezoelectric actuator of claim 1. The piezoelectric actuator 100 is driven by two independent voltage sources, a first voltage source 502 and a second voltage source 506 placed in series. The first voltage source 502 and the second voltage source 506 typically generate a voltage on the order of 100 volts to generate the movement of the piezoelectric actuator 100. The first voltage source 502 is coupled to the first piezoelectric actuator element 150 and generates the control signal 110 and a reference signal 110'. The second voltage source 506 is coupled to the second piezoelectric actuator element 152 and generates the control signal 108 and a reference signal 108'. The polarity 504 of the first voltage source 502 can be reversed to generate the movement of the first piezoelectric actuator element 150 in the opposite direction 414. The polarity 508 of the second voltage source 506 can be reversed to generate the movement of the second piezoelectric actuator element 152 in the opposite direction 414.

Figure 6:
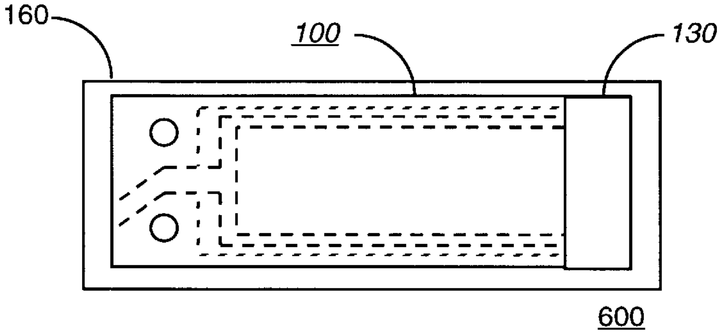
FIG. 6 is a plan view of a resonant piezoelectric alerting device in accordance with the present invention.

FIG. 6 is a plan view of a resonant piezoelectric alerting device 600 in accordance with the present invention. As shown in FIG. 6, the piezoelectric actuator 100 can be advantageously modified by the addition of a motional mass 130. In operation, resonant piezoelectric alerting device 600 is responsive to the control signals being generated to generate an alternating out-of-plane movement of said motional mass. The alternating out-of-plane movement of the motional mass is transformed by the actuator mount 132 into tactile energy which can be advantageously utilized to provide a tactile alert in an electronic device, as will be described below. The motional mass 130 is preferably a metal, such as iron or steel, a zinc alloy, or lead. It will be appreciated that other metals can be utilized as well. The geometry of the piezoelectric actuator 100 and the mass of the motional mass 130 are selected to provide a resonance at a predetermined frequency which maximizes the amplitude of movement of the motional mass 130. When the resonant piezoelectric alerting device 600 is utilized in an electronic device which is fastened to the belt of a user, the predetermined frequency which maximizes the movement of the motional mass 130, and the tactile impulse imparted to the user's wrist, is approximately 100 Hertz. For other applications, such as when the electronic device is fastened to the user's wrist, the predetermined frequency will typically be higher to impart the same relative tactile stimulation to the user.

Figure 7:
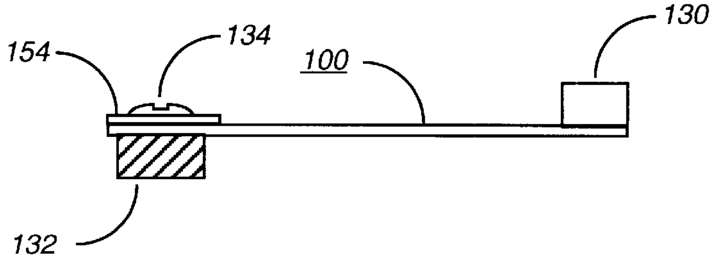
FIG. 7 is a side view of the resonant piezoelectric alerting device in accordance with the present invention.

FIG. 7 is a side view of the resonant piezoelectric alerting device 600 in accordance with the present invention. The piezoelectric actuator 100 is rigidly secured to the actuator mount 132 by a fastening element, such as a screw 134 which is used to compress a compression plate 154. Other means of fastening, such a rivets, nuts engaging threaded studs, and thermocompression bonding techniques can be utilized as well.

Figure 8:
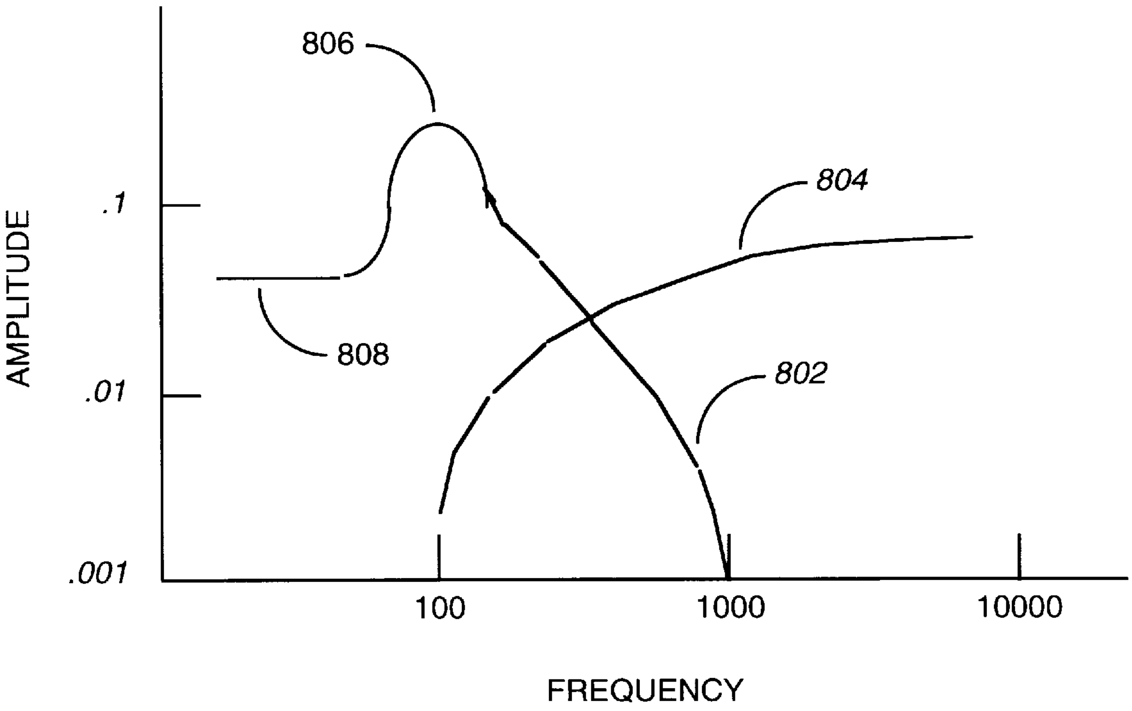
FIG. 8 is a graph illustrating the operation of the resonant piezoelectric alerting device in accordance with the present invention.

FIG. 8 is a graph illustrating the operation of the resonant piezoelectric alerting device 600 in accordance with the present invention. As with a conventional piezoelectric actuator, movement of the piezoelectric actuator 100 in accordance with the present invention is limited at frequencies 808 below the predetermined frequency 806. As the frequency driving the resonant piezoelectric alerting device 600 is increased toward the resonant frequency of the resonant piezoelectric alerting device 600, the amplitude of the movement of the motional mass increases to a maximum at the predetermined frequency 806. Unlike a conventional piezoelectric actuator, in which movement of the piezoelectric actuator drops off significantly as the driving frequency 802 exceeds the predetermined frequency 806, a second advantageous mode of operation occurs as shown by curve 804. The piezoelectric actuator 100 in accordance with the present invention begins to respond as a diaphragm, enabling the resonant piezoelectric alerting device 600 in accordance with the present invention to reproduce the frequencies above the predetermined frequency to provide acoustic energy. The alternate mode of operation of the resonant piezoelectric alerting device 600 in accordance with the present invention will be described in detail below.

Figure 9:
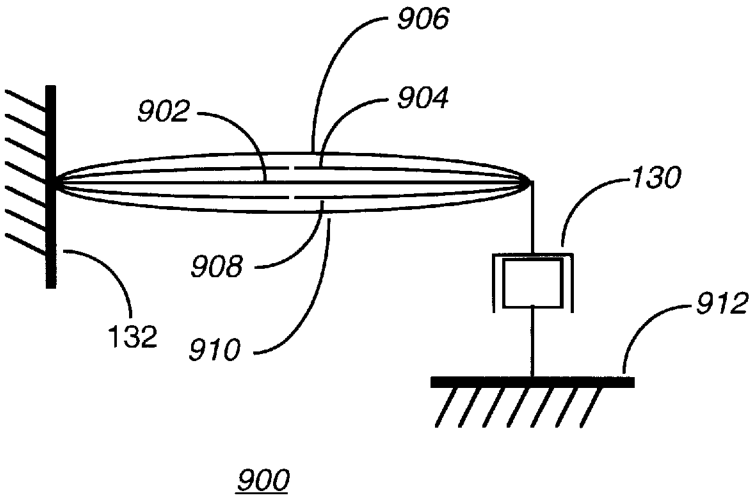
FIG. 9 is a mechanical diagram illustrating an operation of the resonant piezoelectric alerting device in accordance with an alternate embodiment of the present invention.

FIG. 9 is a mechanical diagram illustrating an operation of the resonant piezoelectric alerting device in accordance with an alternate embodiment of the present invention. At frequencies above the predetermined, or resonant frequency, the motional mass 130 acts a mechanical dash pot which is coupled to a virtual rigid surface 912 thereby minimizing motion of the piezoelectric actuator 100 at the free end. At frequencies higher than the predetermined frequency, the out-of-plane movement of the piezoelectric actuator 100 occurs between the actuator mount 132 and the motional mass 130. When no control signal is applied the piezoelectric actuator 100 is at rest 902. When the first piezoelectric actuator element 150, or the second piezoelectric actuator element 152 are individually excited, the piezoelectric actuator produces movement in a first out-of-plane direction 904 or a second out-of-plane direction 908. When the first piezoelectric actuator element 150 and the second piezoelectric actuator element 152 are concurrently excited, the piezoelectric actuator produces movement in a third out-of-plane direction 906 or a fourth out-of-plane direction 910. It will be appreciated that the actual amplitude of movement of the piezoelectric actuator 100 is dependent upon the magnitude of the control signals applied.

Figure 10:
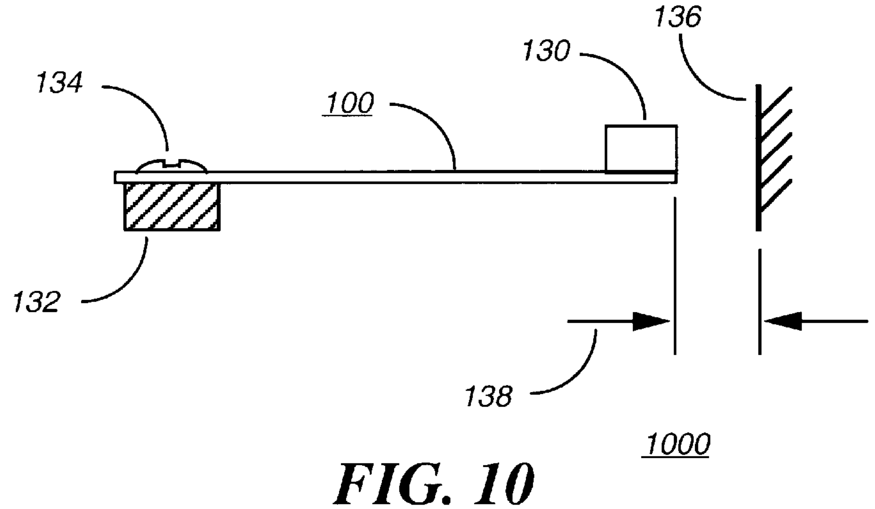
FIG. 10 is a mechanical diagram illustrating an alternate embodiment of the present invention.

FIG. 10 is a mechanical diagram illustrating a damped resonant piezoelectric alerting device 1000 in accordance with the present invention. Unlike the resonant piezoelectric alerting device 600 described above, the operation of the damped resonant piezoelectric alerting device 1000 utilizes a damping element 136 which controls the relative displacement of the piezoelectric actuator 100 and the motional mass 130, thereby controlling the tactile energy output generated by the damped resonant piezoelectric alerting device 1000. When the motional mass 130 is ferromagnetic, the damping element 136 can be a conventional magnet. The displacement of the piezoelectric actuator 100 and the motional mass 130 can be controlled by the energy product of the magnetic material, and by the spacing 138 between the magnet 136 and the motional mass 130. The damping element 136 can be advantageously utilized to control variation in tactile energy output generated by the damped resonant piezoelectric alerting device 1000 due to component variations.

It will be appreciated that the motional mass 130 can be replaced by a magnetic material, and the damping element 136 can then be replaced by a ferromagnetic material, such as the wall of a housing enclosing the resonant piezoelectric alerting device 1000.

Figure 11:
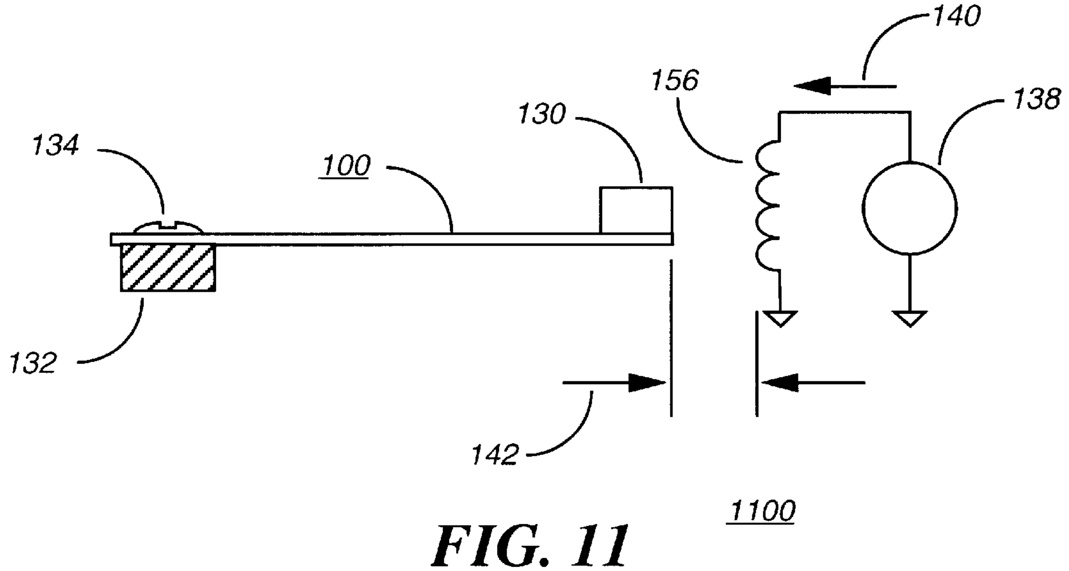
FIG. 11 is a mechanical diagram illustrating another alternate embodiment of the present invention.

FIG. 11 is an electromechanical diagram illustrating an alternate embodiment of the damped resonant piezoelectric alerting device 1000 of the present invention. As shown in FIG. 11, the damping element 136 is replaced by an electromagnetic coil 156 which is driven by a signal generator 138. In this instance, the motional mass 130 is fabricated from a magnetic material. As described above, the damping element 156 controls the relative displacement of the piezoelectric actuator 100 and the motional mass 130, thereby controlling the tactile energy output generated by the damped resonant piezoelectric alerting device 1000. The displacement of the piezoelectric actuator 100 and the motional mass 130 is controlled by energy product of the magnetic material, the spacing 142 between the motional mass 130 and the electromagnetic coil 156, and by the signal amplitude which is a measure of the current 140 flowing through the electromagnetic coil 156.

Figure 12:
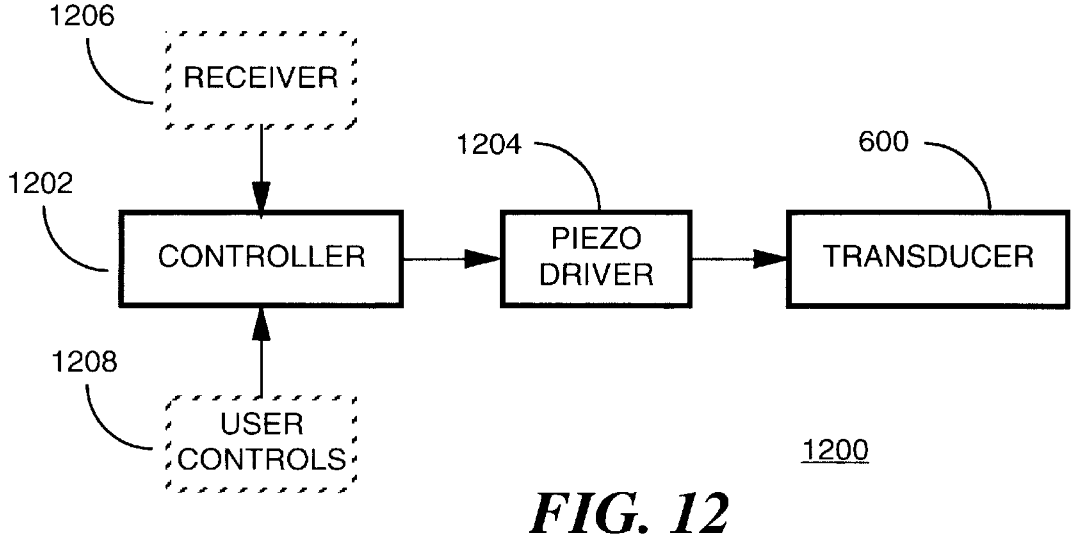
FIG. 12 is an electrical block diagram of an electronic device utilizing the resonant piezoelectric alerting device in accordance with the present invention.

FIG. 12 is an electrical block diagram of an electronic device utilizing the resonant piezoelectric alerting device 600 in accordance with the present invention. The electronic device 1200 can be any electronic device which requires a tactile alerting device, as well as any electronic device which requires an audible alerting device. When the electronic device 1200 is a communication device, such as a pager, cellular phone, or other form of communication device, a receiver 206 is used to receive information transmitted to the device. The receiver 1206 may be used to receiver radio frequency signal, infrared or ultraviolet signals, or be connected to a wireline. Any wireless signaling protocol or wired signaling protocol can be utilized depending on the type of receiver used. A controller 1202 is coupled to the receiver 1206 and is used to control the operation of the electronic device 1200, providing such functions as decoding the information which is receiver, causing the information which is received to be stored, and generating the necessary control signals to effect the generation of a tactile or audible alert. The controller 1202 is coupled to a piezoelectric driver circuit 1204 which generates the signals of the proper amplitude to drive the resonant piezoelectric alerting device 600 described above. Operation of the electronic device 1200 can also be accomplished by user controls 1208 which can be used to reset the alerts being generated, or used to set parameters, such as time, at which an alert will be generated.

We claim:

1. A damped resonant piezoelectric alerting device, comprising:

a motional mass;

a damping element magnetically coupled to said motional mass; and a piezoelectric actuator, constrained to an actuator mount at a first end and coupled to said motional mass at a second end, said piezoelectric actuator being responsive to a control signal, for generating an alternating out-of-plane movement of said motional mass having an amplitude, whereby the alternating movement of said motional mass is transformed into tactile energy to provide a tactile alert, and further whereby the amplitude of the out-of-plane movement of said motional mass is controlled to control the tactile energy delivered.

2. The damped resonant piezoelectric alerting device of claim 1, wherein said control signal alternates between a first polarity and a second opposite polarity.

3. The damped resonant piezoelectric alerting device of claim 1, wherein said piezoelectric actuator comprises:

a flexible substrate; and a first planar piezoelectric element, affixed to a first side of said flexible substrate, and having a first end constrained to said actuator mount and a second end coupled to said motional mass, wherein said first planar piezoelectric element is responsive to the control signal for generating an out-of-plane motion of said motional mass.

4. The damped resonant piezoelectric alerting device of claim 3, wherein said piezoelectric actuator further comprises a second planar piezoelectric element, affixed to a second side of said flexible substrate, and having a first end constrained to said actuator mount and a second end coupled to said motional mass, wherein said second planar piezoelectric element is responsive to the control signal for also generating an out-of-plane motion of said second end of said second planar piezoelectric element, wherein actuation of said first planar piezoelectric element and said second planar piezoelectric element generates and increased out-of-plane movement of said motional mass.

5. The damped resonant piezoelectric alerting device of claim 4, wherein said control signal alternates between a first polarity and a second opposite polarity, and wherein said out-of-plane motion of said first planar piezoelectric element and said second planar piezoelectric element is directed in a first direction in response to the control signal having the first polarity, and in a second opposite direction in response to the control signal having the second opposite polarity.

6. The damped resonant piezoelectric alerting device of claim 1, wherein said motional mass is fabricated from a metal.

7. The damped resonant piezoelectric alerting device of claim 1, wherein said out-of-plane movement generates a linear movement of said motional mass.

8. The damped resonant piezoelectric alerting device of claim 1, wherein said alternating out-of-plane movement of said motional mass is a maximum at a predetermined frequency of the control signal.

9. The damped resonant piezoelectric alerting device of claim 8, wherein the predetermined frequency is 100 Hertz.

10. The damped resonant piezoelectric alerting device of claim 8, wherein additional out-of-plane movement of said piezoelectric actuator occurs between said actuator mount and said motional mass at frequencies above the predetermined frequency, wherein said additional out-of-plane movement of said piezoelectric actuator generates acoustic energy.

11. The damped resonant piezoelectric alerting device of claim 1, further comprising a housing for enclosing said motional mass and said piezoelectric actuator.

12. The damped resonant piezoelectric alerting device of claim 11, wherein said housing is fabricated from a metal.

13. The damped resonant piezoelectric alerting device of claim 1, wherein said damping element is a housing fabricated from a metal, and wherein said motional mass is fabricated from a magnetic material.

14. The damped resonant piezoelectric alerting device of claim 1, wherein said motional mass is fabricated from a ferromagnetic material, and wherein said damping element is fabricated from a magnetic material.

15. The damped resonant piezoelectric alerting device of claim 1, wherein said motional mass is a magnetic material, and wherein said damping element is fabricated from a ferromagnetic material.

* * * * *